United States Patent
DiSaverio et al.

(10) Patent No.: US 7,948,120 B2
(45) Date of Patent: May 24, 2011

(54) MODULAR POWER DISTRIBUTION BACKPLANE, SYSTEM, AND METHOD

(75) Inventors: Charles T. DiSaverio, Apalachin, NY (US); Timothy Williams, Binghamton, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 224 days.

(21) Appl. No.: 12/326,512

(22) Filed: Dec. 2, 2008

(65) Prior Publication Data
US 2010/0134958 A1 Jun. 3, 2010

(51) Int. Cl.
*H01B 7/30* (2006.01)
(52) U.S. Cl. .................. 307/147; 307/9.1; 710/8
(58) Field of Classification Search .......... 439/34, 439/35, 289, 577, 218, 678, 679; 307/10.1, 307/147, 9.1; 361/627, 679.02, 748, 752; 710/8
See application file for complete search history.

(56) References Cited

U.S. PATENT DOCUMENTS

| | | | |
|---|---|---|---|
| 4,009,375 A | 2/1977 | White et al. | |
| 6,009,363 A | 12/1999 | Beckert et al. | |
| 6,052,632 A | 4/2000 | Iihoshi et al. | |
| 6,055,144 A | 4/2000 | Reid | |
| 6,127,741 A | 10/2000 | Matsuda et al. | |
| 6,377,860 B1 | 4/2002 | Gray et al. | |
| 6,421,593 B1 | 7/2002 | Kempen et al. | |
| 6,501,368 B1 | 12/2002 | Wiebe et al. | |
| 6,580,953 B1 | 6/2003 | Wiebe et al. | |
| 6,640,272 B1 * | 10/2003 | Hartwell et al. | 710/104 |
| 6,737,762 B2 | 5/2004 | Koenig | |
| 6,829,527 B2 | 12/2004 | Felke et al. | |
| 6,865,460 B2 | 3/2005 | Bray et al. | |
| 6,879,895 B2 | 4/2005 | Capps et al. | |
| 6,970,772 B2 | 11/2005 | Radtke et al. | |
| 7,037,124 B2 | 5/2006 | Lee et al. | |
| 7,173,347 B2 | 2/2007 | Tani et al. | |
| 7,181,511 B1 | 2/2007 | Grenier et al. | |
| 7,187,563 B1 | 3/2007 | Bobrek | |
| 2002/0032535 A1 | 3/2002 | Alexander et al. | |
| 2003/0078997 A1 * | 4/2003 | Franzel | 709/220 |
| 2004/0178679 A1 | 9/2004 | Kabasawa | |
| 2005/0167172 A1 | 8/2005 | Fernandez | |
| 2006/0128230 A1 | 6/2006 | Korczynski et al. | |
| 2007/0073944 A1 | 3/2007 | Gormley | |
| 2007/0228826 A1 | 10/2007 | Jordan et al. | |
| 2007/0241614 A1 | 10/2007 | Busdiecker et al. | |
| 2007/0270045 A1 | 11/2007 | Korczynski et al. | |
| 2009/0011639 A1 * | 1/2009 | Ballard et al. | 439/607 |
| 2010/0109430 A1 * | 5/2010 | DiSaverio et al. | 307/10.1 |

FOREIGN PATENT DOCUMENTS

| | | |
|---|---|---|
| CA | 2314307 | 1/2002 |
| FR | 2881295 | 7/2006 |

* cited by examiner

*Primary Examiner* — Jared J Fureman
*Assistant Examiner* — Daniel Cavallari
(74) *Attorney, Agent, or Firm* — Miles & Stockbridge PC; James T. Carmichael; Patrick L. Miller

(57) ABSTRACT

A modular power distribution backplane, system, and method. The modular power distribution backplane can be configured with a plurality of dual-operation tags for placement of components in the backplane. The system and method also can automatically and electronically ensure and verify proper placement or replacement of components in the backplane.

14 Claims, 6 Drawing Sheets

MODULAR POWER DISTRIBUTION BACKPLANE, SYSTEM, AND METHOD

The present invention relates to a modular power distribution backplane, system, and method. In particular, a backplane according to various embodiments is configured with a plurality of dual-operation tags for placement of components in the backplane. The dual-operation tags can allow for proper placement of components in the backplane, or, put another way, can allow for the prevention of improper or erroneous placement of components in the backplane. Moreover, a system and a method according to embodiments of the present invention are directed to electronically ensuring proper placement and/or replacement of components in a backplane.

Various embodiments of the present invention include a modular power distribution backplane. The modular power distribution backplane can be for a controller area network (CAN) of a vehicle having a J1939 bus. The modular power distribution backplane can be configured to be housed in a housing with an access portion that allows physical access to the modular power distribution backplane. The modular power distribution backplane comprises a base substrate having a first side and a second side opposite to the first side, with the modular power distribution backplane being sized to fit entirely inside the housing. The modular power distribution backplane further comprises a plurality of receptacles coupled to the first side of the base substrate, a controller coupled to the base substrate, and a plurality of dual-operation tags in one-to-one relationship with the receptacles. Each receptacle is configured to receive a modular power component. At least one of the receptacles is configured to receive a modular power component in the form of a circuit board, and at least one of the receptacles is configured to receive a modular power component in the form of a power element. Each dual-operation tag is configured with a visual indicator and as a key for coupling modular power components to correct ones of said receptacles. Each dual-operation tag can be physically configured as the key for coupling modular components to the modular power distribution backplane. Each dual-operation tag is physically configured as the visual indicator, and the visual indicators are visible via the access portion of the housing. The controller is configured to generate information for the physical and electrical coupling of modular power components to receptacles of the modular power distribution backplane. The generated information can include instructions for placement of modular power components in the backplane. The controller is also configured to verify that the modular power components have been properly coupled and to facilitate an indication of the verifying.

Various embodiments of the present invention also include a method for replacing power components coupled to a modular power distribution backplane for a controller area network (CAN) of a vehicle having a bus. The method comprises automatically and electronically determining that a power component coupled to the backplane requires removing, providing electronically generated information for decoupling the power component determined to require removing from the backplane, identifying a power component to replace the power component determined to require decoupling from the backplane, providing electronically generated information associated with the identified power component, electronically verifying that the identified power component has been coupled based on the electronically generated information for coupling, and providing an electronic indication of said electronically verifying. The electronically generated information for decoupling the power component determined to require removing from the backplane can be in at least one of visual form and audio form. The electronically generated information associated with the identified power component can include information for physically coupling and electrically coupling the identified power component to a receptacle of the backplane and may be in at least one of visual form and audio form. The electronic indication also can be in at least one of visual form and audio form.

In addition, embodiments of the present invention include a system for intelligent placement of electronic components in a backplane for a vehicle. The system comprises outputting means for outputting electronically generated information, verifying means for electronically verifying placement of electronic components in the backplane, and outputting means for outputting electronically generated verification information of the placement of components in the backplane. The electronically generated information of the outputting means includes information for physically placing and electrically placing electronic components in the backplane. The verifying of the verifying means can be based on the information for physically placing and electrically placing electronic components in the backplane.

BRIEF DESCRIPTION OF THE DRAWINGS

The accompanying drawings illustrate embodiments of the invention. The invention will be best understood by reading the ensuing specification in conjunction with the drawing figures, in which like elements are designated by like reference numerals, and wherein.

DETAILED DESCRIPTION

Embodiments of the present invention are directed generally to a modular power distribution backplane. In particular, the backplane according to various embodiments is configured with a plurality of dual-operation tags for placement of components in the backplane. The modular power distribution backplane can have a set of tags that act both as labels or visual indicators for modular components and as keys to prevent the substitution or placement of an incorrectly matched component. The dual-operation tags can be oriented to allow for convenient visual inspection and verification.

Embodiments of the present invention also are directed generally to a modular power distribution system and method implementing a modular power backplane. In particular, the system and method according to various embodiments are directed to ensuring proper placement, replacement, and/or coupling of components in the modular power backplane.

Some or all of the positions or receptacles of the backplane can have a same appearance or physical configuration. The system and method according to embodiments of the present invention provides for reliably mating or coupling (electronically and/or physically) components to the backplane. Moreover, embodiments of the present invention can prevent erroneous identification of components to be replaced or to replacing with, as well as improper or erroneous connection of components to the backplane. Embodiments of the present invention also can decrease a time to identify components to be replaced or to do replacing with, to properly place components, and/or to properly replace components.

Figure 1:
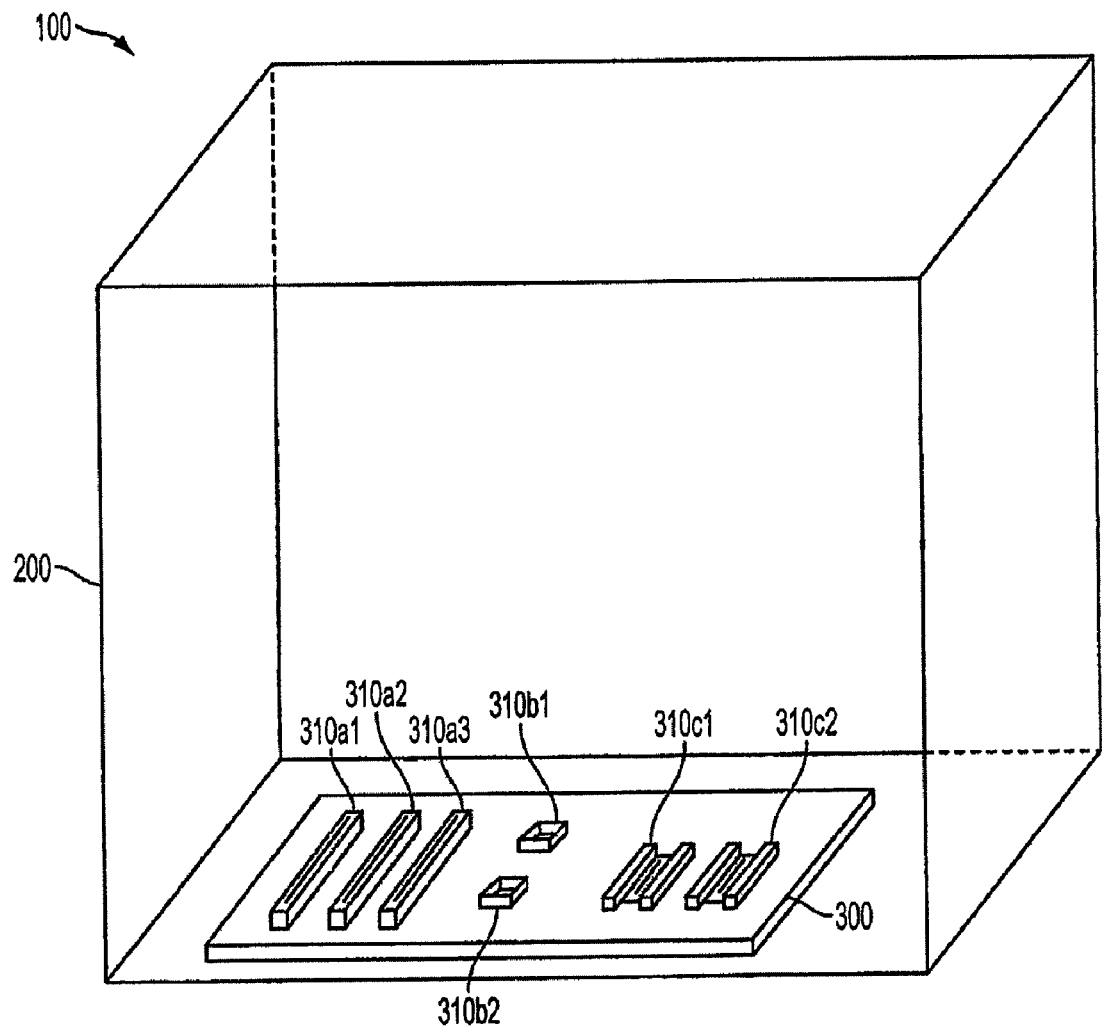
FIG. 1 is a backplane in a housing according to an embodiment of the present invention.

FIG. 1 shows a system 100 including a housing 200 which can house a backplane 300 according to an embodiment of the present invention.

Housing 200 can be any suitable housing for use with any suitable system (such as a controller area network of a vehicle having a J1939 bus or optionally a MIL1553 bus) or apparatus. In various embodiments, housing 200 can be implemented in a vehicle, such as a car, a truck, a trailer, etc. Additionally, as is described in more detail below with respect to FIG. 6, a housing 200 can be implemented in each of a vehicle (e.g., truck) and a trailer, wherein the truck and trailer are coupled together such that they are in communication with each other. For example, the vehicle and trailer can be coupled together via a communication bus, such as a J1939 bus. Furthermore, in various embodiments, a housing 200 (and the components configured therein) in the vehicle can be interchangeable with the housing 200 (and components configured therein) of the trailer, and vice versa. For example, say a housing 200, or any of the components in the housing become damaged, inoperable, or malfunction, the housing 200 in the vehicle may be removed and replaced with the housing in the trailer. Likewise, any of the components, such as a backplane, in the vehicle can be replaced with components from the trailer and vice versa. In various embodiments, the housing may be universal, such that one type or configuration of housing can be implemented in a number of different systems, vehicles, or combination thereof.

Moreover, housing 200 can have any suitable configuration. For example, FIG. 1 shows housing 200 as a stand-alone enclosure, which, in various embodiments of the present invention, can be installed in a system or coupled to an apparatus. In other embodiments, housing 200 can be formed by a portion of a system or an apparatus, such as a chassis or body portion of a vehicle. Housing 200 also can have any suitable shape or size. The housing 200 shown in FIG. 1 is rectangular, for example.

Housing 200 can have any suitable dimensions and can be sized to house any suitable system, device, component, etc., as well as any suitable number and/or combination of systems, devices, components, etc. For example, the housing 200 in FIG. 1 houses a backplane 300. Note that even though FIG. 1 shows only the backplane 300 presently housed in the housing 200, housing 200 can also house components coupled to the backplane 300. Additionally, in embodiments of the present invention, each system, apparatus, or component housed by the housing 200 typically is completely inside the housing 200. Although in some instances one or more of the components or associated elements thereof can extend outside the housing 200, such as during a testing operation.

The housing 200 according to embodiments of the present invention also can include one or more access portions (not explicitly shown). The one or more access portions can provide for physical access to the inside of the housing 200, and, thus, physical access to any systems, apparatuses, or components housed therein. For example, the front side of housing 200 of FIG. 1 can be either removed or "opened" to provide access to inside housing 200. One or more of the access portions also may allow for visual access to inside the housing 200 via a transparent substrate, such as glass. Access portions also can provide for electrical coupling of systems, devices, and/or components housed in housing 200 to other electrical or electronic systems, devices, components, etc. external to the housing 200.

Backplane 300 can be any suitable backplane of any suitable configuration and of any suitable dimensions. In embodiments of the invention, backplane 300 can be physically coupled to housing 200 by any suitable means. Moreover, backplane 300 can be electrically coupled to other electrical or electronic systems, devices, components, etc. external to the housing 200 via one or more access portions (not explicitly shown). Backplane 300 also can be electrically coupled to the housing 200 (e.g., grounded). Backplane 300 also can be interchangeable with other backplanes. Additionally, backplane 300 may be universal in the sense that it can be used with a number of different types of systems, vehicles, or combination thereof. For example, a backplane 300 may be configured to be implemented in a vehicle and also in a trailer coupled to the vehicle. Thus, a backplane 300 in a trailer may be removed from the trailer and added to the vehicle. Similarly, components coupled to the backplane also can be universal.

FIG. 1 shows a backplane 300 according to embodiments of the invention having a base substrate with a first side and a second side opposite to the first side. The first side of the backplane 300 can have coupled thereto a plurality of receptacles 310. Backplane 300 can have any suitable type or configuration of receptacle 310 attached thereto, as well as any suitable number of receptacles. FIG. 1, for example, shows seven receptacles 310 of various configurations.

Receptacles 310 can have any suitable configuration and can be for any suitable purpose. In various embodiments of the invention, each receptacle 310 is configured to receive a modular power component, such as a power element or a circuit board. One or more of the receptacles 310 also can be configured to receive a controller or a processor. For example, in FIG. 1, each of receptacles 310a and receptacles 310c may be configured to receive a circuit board, and each of receptacles 310b may be configured to receive a modular power component. Receptacles 310b also can be configured to receive a controller or a processor, for example. Though not shown, a controller or a processor could be coupled directly to one of the first or second sides of the substrate of the backplane 300.

Figure 2:
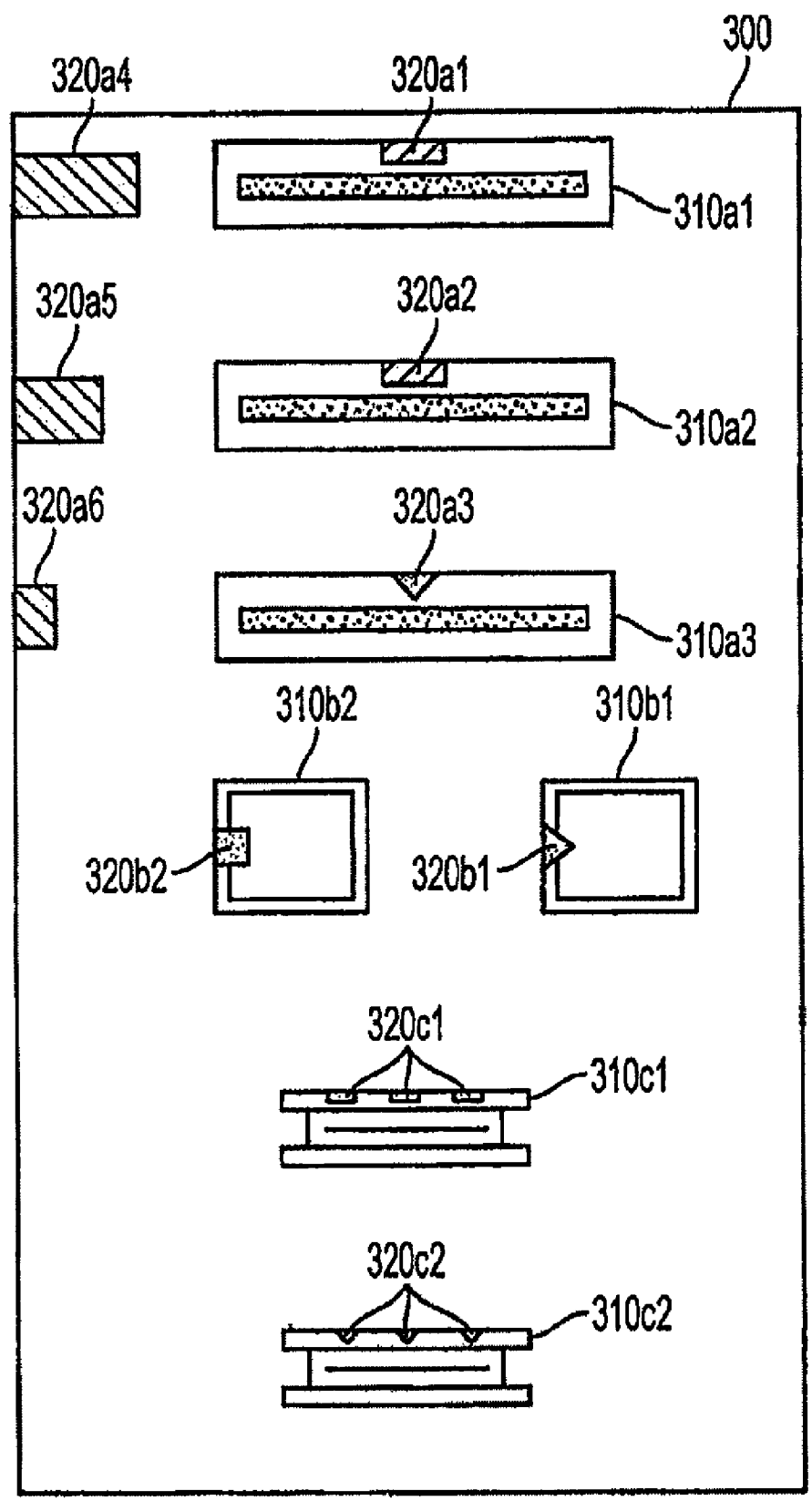
FIG. 2 is an overhead view of a backplane according to an embodiment of the present invention.

FIG. 2 shows an overhead view with respect to a first side of a backplane 300 according to another embodiment of the invention. As can be seen from FIG. 2, backplane 300 also has coupled thereto seven receptacles 310. Also shown in FIG. 2 are a plurality of dual-operations tags 320.

Dual-operation tags 320 can be of any suitable configuration and of any suitable number. Moreover, some or all of the dual-operation tags 320 can be of the same configuration. In addition, in an alternative embodiment, none of the dual-operation tags 320 are the same. For example, each receptacle 310 can have associated therewith at least one dual-operation tags 320. In some instances, the dual-operation tags 320 and the receptacles 310 are in one-to-one relationship with each other. For instance, receptacle 310*b*1 in FIG. 2 has associated therewith only one dual-operation tag 320*b*1. In other instances, some or all of the receptacles 310 can have associated therewith a plurality of dual-operation tags. For example, in FIG. 2, receptacle 310*a*1 has associated therewith dual-operation tag 320*a*1 and dual-operation tag 320*a*4. FIG. 2 also shows receptacle 310*c*1, for example, having a plurality of dual-operation tags 320*c*1 associated therewith. Note that a plurality of dual-operation tags, such as those designed 320*c*1 or the combination of 320*a*1 and 320*a*4 in FIG. 2 may be viewed on the whole as one dual-operation tag, and, thus, the group may be considered as being in one-to-one relationship with the associated receptacle 310.

Each dual-operation tags 320 can be arranged at any suitable position on the backplane 300. For example, some dual-operation tags, such as 320a4-6 in FIG. 2, can be arranged on the first side of the backplane 300 such that they correspond with respective receptacles 310. Other dual-operation tags 320 can be arranged on respective receptacles 310 themselves. For example, dual-operation tags 320a1-3, 320b1-2, 320c1-2 shown in FIG. 2 can be arranged on their respective receptacles 310. In some embodiments, one or more dual-operation tag 320 can be either integral to or formed in one piece with the associated receptacle 310.

Each tag 320 is "dual-operational" in the sense that the tag operates or functions both as a visual indicator and as a physical key for coupling components to associated receptacles 310. Specifically, each dual-operational tag 320 can allow for proper placement of components in the backplane 300, or, put another way, can allow for the prevention of improper or erroneous placement of components in the backplane 300. Thus, each dual-operation tag 320 is configured as a visual indicator and as a key for coupling components to associated receptacles 310.

The visual indicator operation of each dual-operation tag 320 can be based on any suitable characteristic, such as physical configuration, a location (on the backplane 300 or on a receptacle 310), an arrangement, a shape, a size, a color, a number of tags, a label or indicia on the dual operation tag 320, etc. The visual indicator operation of the dual-operation tags 320 can facilitate proper placement or coupling of components to associated receptacles 310. Put another way, the visual indicator operation of the dual-operation tag 320 can prevent improper placement or coupling of components to associated receptacles 310. In various embodiments of the present invention, the dual-operation tags 320 are visible via one or more of access portions of the housing 200. Thus, a user can readily identify, visually, characteristics of the dual-operation tags 320 to place or couple components to receptacles 310 of the backplane 300.

The physical key operation of each dual-operation tag 320 can be based on a physical characteristic of the dual-operation tag 320 and/or a physical location of the dual-operation tag 320. For example, one or more of the dual-operation tags 320 can be configured either on the backplane 300 or on a receptacle 310 to physically ensure proper placement of components to associated receptacles 310. Put another way, the physical key operation of the dual-operation tag 320 can prevent improper placement or coupling of components to associated receptacles 310.

Figure 3:
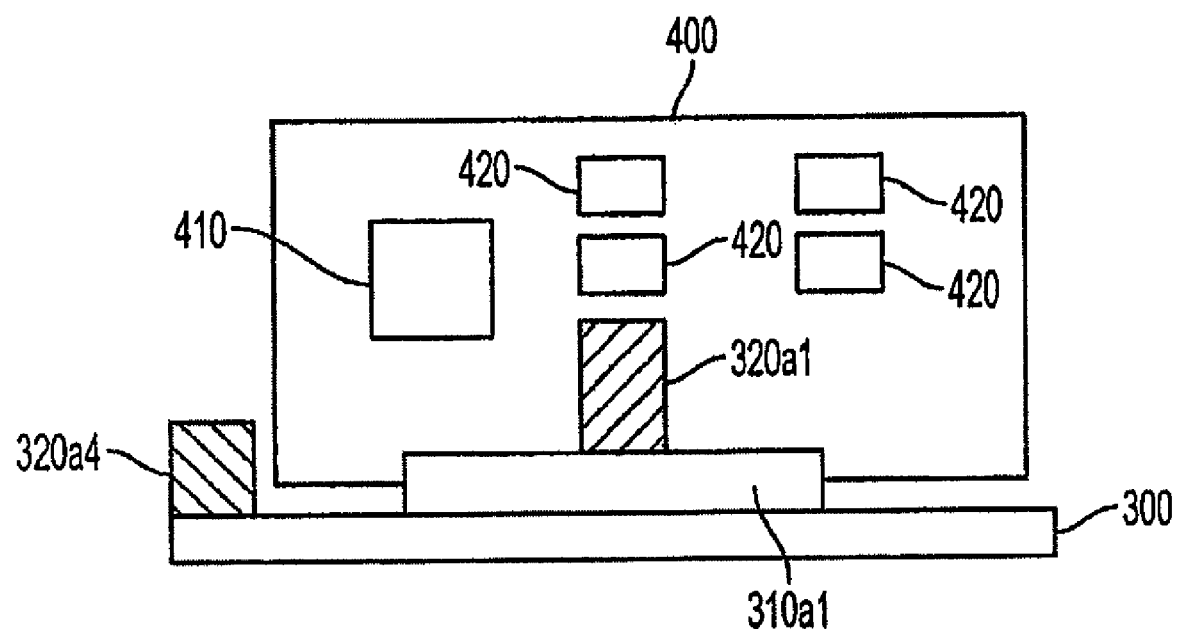
FIG. 3 is a side view of a backplane with a component coupled thereto according to an embodiment of the present invention.

FIG. 3 is a side view of a backplane with a component coupled thereto according to an embodiment of the present invention. In the example shown in FIG. 3, receptacle 310a1 of backplane 300 has coupled thereto a component in the form of a circuit board 400. The circuit board 400 shown in FIG. 3 can include a plurality of components 410, 420. Components 420 can be power components, of which may or may not be the same, and component 410 can be a controller, for example.

By way of example, the backplane 300 may require a specific type of component 400 to be coupled to a particular receptacle 310, or may require a specific type of component 400 not to be coupled to a particular receptacle 310. For example, in FIG. 3, for various reasons, it may be necessary for only a certain type of component to be coupled to receptacle 310a1. Dual-operation tag 320a4 can have a physical position and configuration to physically prevent a component from being coupled to the receptacle 310a1. For example, when attempting to couple a component that should not be coupled to receptacle 310a1, such as a circuit board having a dimension that would extend into the physical space of dual-operation tag 320a4, the dual-operation tag 320a4 can physically prevent the component from being properly coupled to the receptacle 310a1, and thus to the backplane 300. The circuit board 400 shown in FIG. 3 does not extend into the physical space of dual-operation tag 320a4, and, thus, is not prevented from being properly coupled to receptacle 310a1 by dual-operation tag 320a4. Therefore, the exemplary circuit board 400 in FIG. 3 can properly be coupled to receptacle 310a1. A proper coupling generally can mean an intended physical and electrical coupling between the receptacle and the component.

Similarly, dual-operation tag 320a1, for example, can have a physical position and configuration to physically prevent a component from being coupled to receptacle 310a1. For example, when attempting to couple a component that should not be coupled to receptacle 310a1, such as a circuit board with a particular configuration of components coupled thereto, the dual-operation tag 320a1 can physically prevent the component (e.g., circuit board) from being properly coupled to receptacle 310a1, and thus to backplane 300. The circuit board 400 with components 420, 410 in FIG. 3 does not have components that would or do extend into the physical space of the dual-operation tag 320a1. Therefore, the exemplary circuit board 400 in FIG. 3, with the particular configuration of components 420, 410 can properly be coupled to receptacle 310a1. A proper coupling generally can mean an intended physical and electrical coupling between the receptacle and the component.

Figure 4:
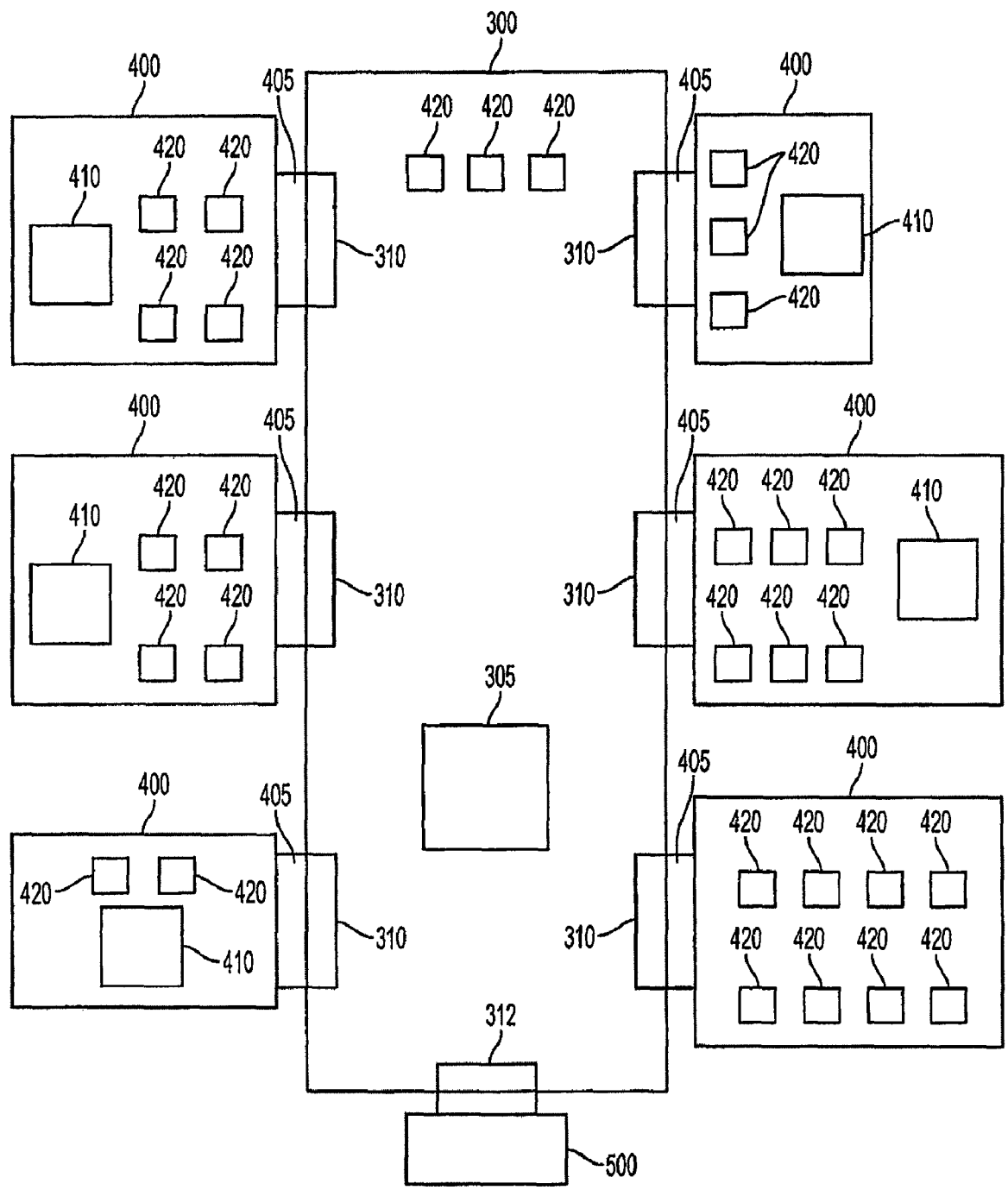
FIG. 4 shows a backplane with a plurality of components coupled thereto according to an embodiment of the present invention.

FIG. 4 shows a block diagram representation of a backplane 300 according to various embodiments of the present invention. Backplane 300 can be of any suitable configuration, and can be for use with any suitable system (such as a controller area network of a vehicle having a J1939 bus or optionally a MIL1553 bus) or apparatus. Moreover, backplane 300 can have any suitable number of components or elements coupled thereto. In FIG. 4, for example, backplane 300 has coupled thereto a plurality of circuit boards or cards 400 and a plurality of components 420. Optionally, backplane 300 can include a controller 305. Though FIG. 4 shows controller 305 located on the backplane 300, the controller 305 does not have to be located on the backplane 300. Backplane 300 also can also optionally include a power supply 500. FIG. 4 shows power supply 500 being coupled to backplane 300 via receptacle 312. However, in other embodiments, a power supply can be provided "on-board" backplane 300.

In various embodiments, circuit boards 400 can have receptacles 405, and the circuit board receptacles 405 can mate to receptacles 310 of the backplane 300 to physically and electrically couple the circuit boards 400 to the backplane 300. Similarly, the power supply 500 shown in FIG. 4 can be physically and electronically coupled to backplane 300 via receptacle 312.

Circuit boards 400 can be of any suitable configuration. For example, some, none, or all of the circuit boards 400 can be of the same dimensions and/or have the same configuration of components. FIG. 4 shows a plurality of different-sized circuit boards 400 having a various configurations of components. The circuit boards 400 shown in FIG. 4 are illustrative only and not meant to limit the dimensions of the circuit boards 400 or available configurations of components 410, 420 (including positioning, numbers, omission of components for some circuit boards, etc.). Thus, some, none, or all of the circuit boards 400 can have one or more of components 420 and 410.

Components 420 can be any suitable component, such as a power or electronic component or element used for providing or controlling power, for example. Component 410 likewise can be any suitable component, such as a controller. Additionally, some or all of the components 400, 410, 420 can be modular and can be removably coupled to the backplane 300, or removably coupled to component 400 for components 410, 420, when component 400 is a circuit board or card. In various embodiments, the components can be modular power components as described in U.S. patent application Ser. No. 12/266,284 filed Nov. 6, 2008, entitled "MODULAR POWER DISTRIBUTION SYSTEM, METHOD, AND APPARATUS HAVING CONFIGURABLE OUTPUTS," the entire contents thereof being incorporated herein by reference.

Controller 305 can be any suitable controller, including, but not limited to, a processor, a microprocessor, a microcontroller, etc. Controller 305 can be configured to perform any suitable function or operation. Generally speaking, controller 305 can be an intelligent power block controller with an electronic instruction and verification display that can indicate the location and class of component to use as a replacement, that can indicate where the component goes, and that can verify proper replacement. The controller 305 also can have an electronic instruction and verification for both a vehicle and a trailer coupled to the vehicle.

In various embodiments, controller 305 can be configured to generate information for the physical and electrical coupling of components 400, 420 to receptacles 310 of the backplane 300. The information generated can be any suitable information, such as instructions for physical coupling of components 400, 420 to backplane 300. Optionally, the generated information also can include instructions for electrically coupling components 400, 420 to backplane 300. Another option for the generated information can include information about location in the backplane 300 for placement. In various embodiments, the information generated can further include a location in the system or apparatus (e.g., particular location in a vehicle) of a backplane 300 of a plurality of backplanes (not explicitly shown) for placement or coupling of components thereto. All of the foregoing examples of information can be provided, or, optionally, only some of the examples of information can be provided. In various embodiments, controller 305 also can be configured to generate information for the physical and electrical placement or coupling of components 410, 420 to the components 400 (e.g., circuit boards) that are coupled to the backplane 300 via receptacles 310. Also note that the controller 305 can be configured to generate information for the physical and electrical coupling of components in a different system or vehicle than the one in which it is arranged. For example, a controller in a vehicle can generate information for physical and electrical coupling of components in a trailer coupled (electrically and/or physically) to a vehicle. Similarly, a controller in a trailer, for example, can generate information for physical and electrical coupling of components in a vehicle coupled (electrically and/or physically) to the trailer.

Controller 305 also can be configured to verify that one or more of the components 400, 420 have been properly coupled to the receptacles 310, and thus to the backplane 300. Similarly, in various embodiments, controller 305 also may be configured to verify that one or more of the components 410, 420 have been properly coupled to respective components 400 (e.g., circuit boards or cards), for example. In various embodiments, the verification can be done based on information generated for physical and electrical coupling. Moreover, in various embodiments, the verification can be done electronically, and, optionally, automatically. Also note that the controller 305 can be configured to verify that one or more of the components 400, 420 have been properly coupled to the receptacles 310, and thus to the backplane 300 in a different system or vehicle than the one in which it is arranged. For example, a controller in a vehicle can verify that one or more of the components 400, 420 have been properly coupled to the receptacles 310 in a trailer coupled (electrically and/or physically) to a vehicle. Similarly, a controller in a trailer, for example, can verify that one or more of the components 400, 420 have been properly coupled to the receptacles 310 in a vehicle coupled (electrically and/or physically) to the trailer.

Controller 305 additionally may be configured to facilitate an indication of the verifying. In various embodiments, such indication of the verification can be generated electronically, and, optionally automatically. The indication of verification can be output in any suitable format, by any suitable means. For example, the indication of verification can be output visually by a monitor, a display, a light, a LED, a control panel, etc. As another option, the indication can be output auditorially by a speaker, for example. In various embodiments, the indication of verification can be output both visually and auditorially, using any combination of visual and audio means provided above.

Furthermore, controller 305 can be configured to determine whether a component 400, 420 already coupled to the backplane 300 requires replacing. In various embodiments, controller 305 may be configured to determine whether a component 410, 420 already coupled to the corresponding component 400 (e.g., circuit board or card) requires replacing. The determining can be done electronically and automatically. Alternatively, the determining can be initiated based on an input, such as a user initiating a test sequence. Of course both automatic and user-initiated determining can be available options in one embodiment. The component requiring replacing may need to be replaced for any suitable reason, such as because it is defective, malfunctioning, will soon become defective or malfunction, has exceeded its lifecycle, for design choice, etc. Controller 305 may also be configured to facilitate an indication of the already coupled component 400, 410, 420 to be replaced, such as a location, an indicator, a reason for replacement, etc. Controller 305 can also identify another component 400, 410, 420 to replace the component 400 (or 410, 420) to be replaced. The identification may include the name of the component, a type of component to do the replacing, and/or a location of the component or type of component for replacing (e.g., location in a warehouse, storeroom, etc.).

Controller 305 can be configured to perform any of the foregoing operations and functions for a system or vehicle other than the one in which it is physically located. For example, controller 305 can be physically located in a vehicle and can perform any of the foregoing operations and functions for a trailer coupled thereto.

Figure 5:
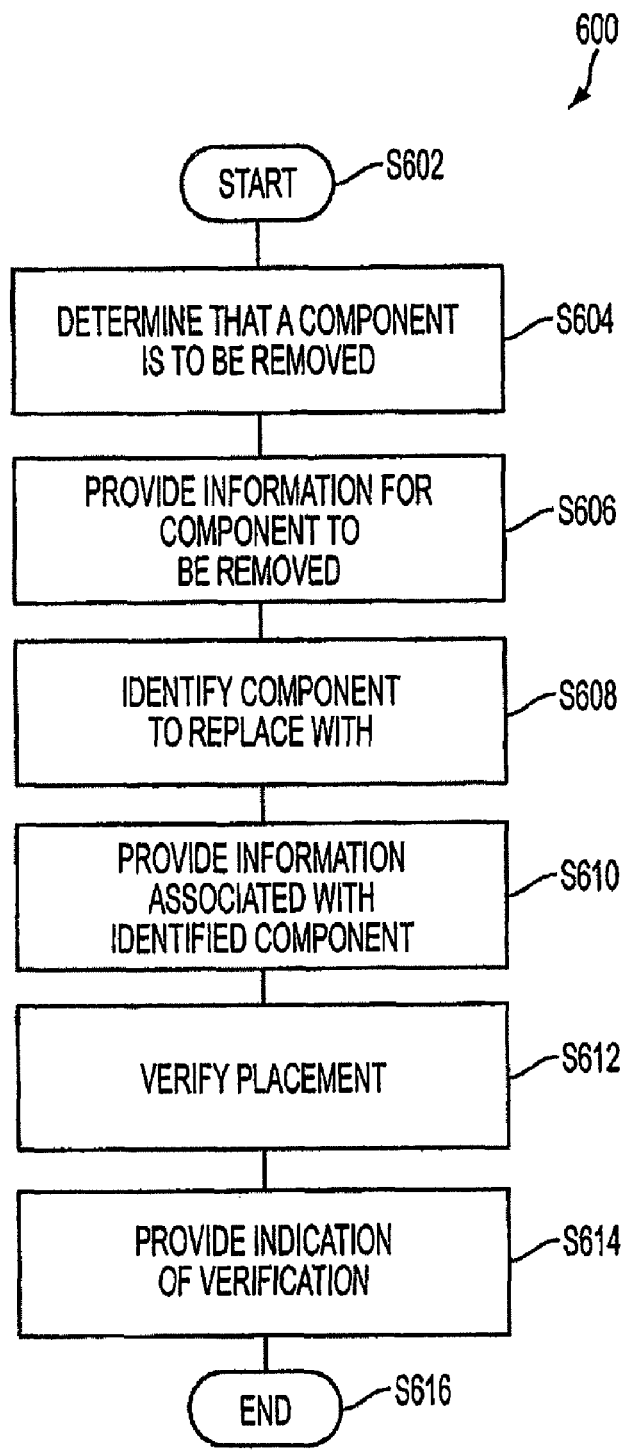
FIG. 5 is a flow chart representation of a method according to an embodiment of the present invention.

FIG. 5 is a flow chart representation of a method 600 according to various embodiments of the present invention. In various embodiments, method 600 can be for reliably placing, replacing, or coupling components 400, 420 with respect to a backplane 300, for example. The backplane 300 can be any suitable backplane, such as a modular power distribution backplane. The method 600 also can include intelligent placement, replacement, or coupling of components with respect to the backplane 300. Various embodiments also may include removing, replacing, or decoupling of components 400, 420 from the backplane 300. The method 600 according to various embodiments of the present invention can be implemented with any suitable system or apparatus. For example, the method 600 may be implemented in a controller area network having a J1939 or MIL1553 bus.

As noted above, the components 400, 420 can be any suitable components, such as electronic or electrical components used for providing or controlling power, for example. In various embodiments, the electrical components 400, 420 may include one or more of circuit boards 400 for coupling to the backplane 300, modular elements 420 for coupling to the circuit boards 400, and modular elements 420 for coupling to the backplane 300. Moreover, the backplane 300 can be of any suitable configuration. In various embodiments, the backplane 300 may include receptacles 310 for mating with or receiving components 400, 420. In various embodiments, one or both of the backplane 300 and the receptacles 310 can include dual-operation indicators 320. The dual operation indicators 320 may be configured for physically and visually ensuring proper placement of components in or on the backplane 300. For example, dual operation indicators 320 may have a first operation as a visual verification means for coupling an associated electrical component 400, 420 to a proper location in the backplane 300 (e.g., to a receptacle 310), and may have a second operation as a key to prevent improper coupling of electrical components 400, 420 to the backplane 300. The visual verification means can take any suitable form, such as, but not limited to, a number, a letter, a word, a marking, a symbol, a picture, etc. on a portion of the dual-operation indicator 320, on a portion of the receptacle 310, or on a portion of backplane 300 associated with either the dual-operation indicator 320 or the receptacle 310; a size of the dual operation indicator 310; a position of the dual operation indicator 310; a number of dual operation indicators (e.g., 320c1) associated with a particular receptacle 310; and a shape of the dual operation indicator 310.

The method 600 may start at S602 and proceed to any suitable step or operation. In various embodiments, the method may proceed to S604.

S604 can be any suitable step or operation. In various embodiments, S604 can include determining whether any of the components 400, 410, 420 needs or requires removing and/or replacing. S604 also can include determining the specific components or components 400, 410, 420 of the plurality that are to be removed or replaced. If it is determined that none of the components 400, 410, 420 requires or needs to be removed or replaced, the method may continue to monitor the components 400, 410, 420 to determine whether any of the components 400, 410, 420 needs or requires replacing (not explicitly shown). If it is determined that one or more of the components 400, 410, 420 requires or needs to be removed or replaced, the method may then determine the component or components 400, 410, 420 to be removed and/or replaced.

In various embodiments, both of the foregoing determinations can be done automatically and/or electronically, and the component or components 400, 410, 420 can be physically and/or electrically coupled to the backplane 300 when the determinations are made. The determinations can be performed by any suitable means. For example, controller 305 coupled to backplane 300 may be configured to perform the determinations. Of course controller 305 does not have to be physically coupled to backplane 300, and may be located "off board" the backplane 300.

The determination as to whether any of the components 400, 410, 420 are to be removed or replaced can be done by any suitable means, such as, but not limited to, polling, monitoring signals from or to the components, monitoring a power supply of the components, etc. In various embodiments, the monitored signals can be based on a J1939 bus. The determination that a specific component or components requires removing or replacing may include identifying the component or components to be removed or replaced. The identifying can be done automatically and/or electronically by any suitable means. For example, controller 305 (or 410) may identify the component or components 400, 410, 420 to be removed or replaced. Moreover, controller 305 can perform the identification by any suitable means, such as, but not limited to, a lookup table in memory.

The components 400, 410, 420 may need or require removal or replacing for any suitable reason and on any suitable basis. For example, components 400, 410, 420 may require removal or replacing because one or more of the components has been determined to be faulty, because it has been determined that one or more of the components will become faulty, or because of a desired system configuration requiring different components or a different configuration or placement of components.

After S604, the method may proceed to any suitable step or operation. In various embodiments, the method can proceed to S606.

S606 can be any suitable step or operation. In various embodiments, S606 can include providing an indication associated with one or more already placed electrical components 400, 410, 420 to be removed or replaced. Information associated with components 400, 410, 420 determined to require removing or replacing can be provided or indicated by any suitable means. In various embodiments, the indication can be provided in visual and/or audio form. For example, an indication of the component or components 400, 410, 420 to be replaced may be displayed on a monitor, a control panel, an LED, a light, etc. The associated information of components 400, 410, 420 determined to require removing or replacing may include any suitable information, such as physical location information of the component in the backplane; physical coupling information of the component with respect to the backplane; electrical coupling information of the component with respect to the backplane; a name, indicator, or indicia representing the component or components to be removed or replaced; a type of component to be removed or replaced, etc. The information also may include a reason for removing or replacing the component, such as, but not limited to, the component is faulty, the component is about to become faulty, a different system or backplane configuration has been requested or required, etc. The information also may include instructions for removing or decoupling the component. The method may then proceed to any suitable step or operation. In various embodiments, the method may proceed to S608.

S608 can be any suitable step or operation. In various embodiments, S608 can include identifying a component or components to replace the component or components 400, 410, 420 requiring removal or replacement. In various embodiments, the identifying can include identifying a name, an identifier, a location of where the component for the replacing can be found (e.g., a physical location in a storage facility), a type of component, a configuration of component, etc. In various embodiments, controller 305 can be configured to identify a component or components to replace the component or components 400, 410, 420 requiring removal or replacing. The controller 305 can use any suitable means for identifying the component or components to replace the component or components requiring removal or replacing. For example, controller 305 can access a lookup table of information and data associated with components already placed in the backplane and components that can be placed in the backplane. The lookup table may be stored in memory (not shown) internal or external to the controller 305 and may be a static or a dynamic lookup table. The results of the identification can be provided or output in one or both of audio and visual form, by any suitable means. For example, the results can be output in visual form by way of a display, a control panel, a LED, a light, etc. The results can be output in audio form by a speaker, for example. The method may then proceed to any suitable step or operation. In various embodiments, the method may proceed to S610.

Also note that in various embodiments, method 600 can start at S608. For example, if a backplane 300 does not currently have components 400, 420 coupled thereto, or only needs to add a component coupled thereto, the method may begin by identifying a component or component for placement in the backplane 300 or component 400.

S610 can be any suitable step or operation. In various embodiments, S610 can include providing information associated with the component identified to do the replacing. The information can be provided in any suitable format. In various embodiments, the information can be automatically and/or electronically generated. For example, controller 305 can provide the information. Moreover, the information can be output in one or both of audio and visual form, by any suitable means.

The information associated with the component identified to do the replacing can be any suitable information. For example, the information can be information for physical and/or electrical placement and/or coupling of the component to the backplane 300 or to a component 400 (e.g., circuit board or card). In various embodiments, the information can include an instruction or instructions for physically coupling an identified component 400, 410, 420. The information also may include an instruction or instructions for electrically coupling the identified component 400, 410, 420. The physical coupling information may be with respect to the physical location on the backplane 300 at which the component 400, 420 is to be coupled. Moreover, the physical coupling information may also be with respect to the physical location on component 400 at which the component 410, 420 is to be coupled. The information for physically and/or electrically coupling can include an identifier associated with the component 400, 410, 420 and a physical location in the backplane 300 for physically and/or electrically coupling the component 400, 420.

At some point after the determination that one or more of the components 400, 410, 420 are to be removed or replaced, the component or components determined to require removable or replacement can be removed or decoupled from the backplane 300 or from the component 400. The removal or decoupling can include physically and/or electrically separating the component 400, 410, 420.

The method may then proceed to any suitable step or operation. For example, a component to replace with, or in the case where components are to be added to backplane 300 or component 400, components 400, 410, 420 may be placed and/or coupled to backplane 300 or component 400. The placement and/or coupling can be physically and/or electrically. In various embodiments, the component for placement or coupling can be a component identified for replacing with. The method may then proceed to any suitable step or operation. In various embodiments, the method may proceed to S612. For a component to replace another component in the same receptacle, the first component should be physically and/or electrically removed or decoupled before attempting to place or coupled the second component.

S612 can be any suitable step or operation. In various embodiments, S612 can include verifying that one or more of the components 400, 420 have been properly coupled to the backplane 300. Similarly, in various embodiments, S612 may include verifying that one or more of the components 410, 420 have been properly coupled to respective components 400 (e.g., circuit boards or cards), for example. The verifying can be done in any suitable fashion. For example, in various embodiments, the verifying can be done electronically by controller 305 and/or 410, for example. Moreover, the verifying can be done automatically, or in response to a user input. The verifying also can be performed based on the electronically generated information for placement or coupling the components 400, 410, 420. The method may then proceed to any suitable step or operation. In various embodiments, the method may proceed to S614.

S614 can be any suitable step or operation. In various embodiments, S614 can include providing an indication of the verifying. In various embodiments, controller 305 or 410 may facilitate an indication of the verifying. In various embodiments, such indication of the verification can be generated electronically, and, optionally automatically. The indication of verification can be output in any suitable format, by any suitable means. For example, the indication of verification can be output visually by a monitor, a display, a light, a LED, a control panel, etc. As another option, the indication can be output auditorially by a speaker, for example. In various embodiments, the indication of verification can be output both visually and auditorially, using any combination of visual and audio means provided above.

The method may then proceed to any suitable step or operation. In various embodiments, the method may proceed to S616, where the method ends.

Controller 305 can be configured to perform any of the foregoing operations and functions for a system or vehicle other than the one in which it is physically located. For example, controller 305 can be physically located in a vehicle and can perform any of the foregoing operations and functions for a trailer coupled thereto.

Figure 6:
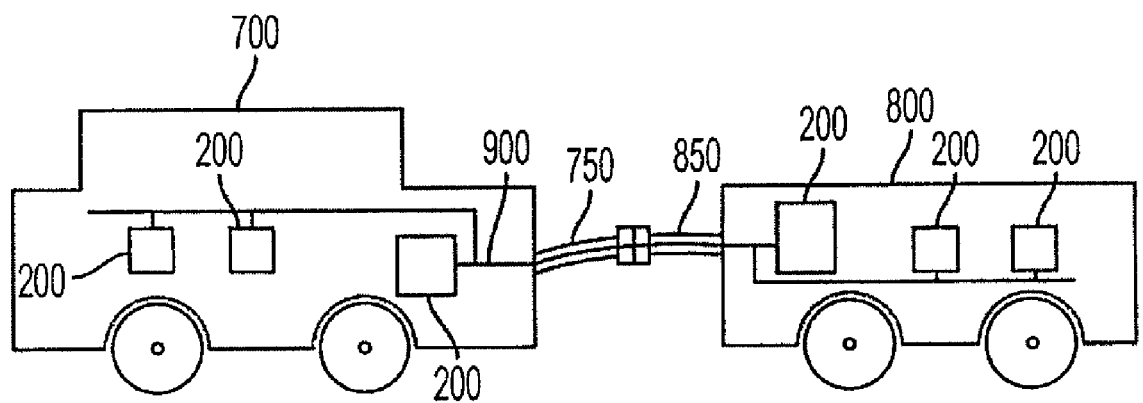
FIG. 6 shows a vehicle and a trailer coupled together via a communication bus according to embodiments of the present invention.

FIG. 6 shows a vehicle 700 and a trailer 800 coupled together according to embodiments of the present invention.

Vehicle 700 can be any suitable vehicle, such as a truck. Trailer 800 can be of any suitable configuration and can be used for any suitable purpose. FIG. 6 shows the vehicle 700 and the trailer 800 including a plurality of housings 200. In this figure, items 200 also could represent a particular system of the vehicle or trailer. Items 200 are coupled together via a bus 900, which can be any suitable bus. The bus can electrically and electronically couple the bus in the vehicle 700 to the bus in the trailer 800. In various embodiments, the bus is a J1939 bus which allows for electrical and electronic communication between the vehicle 700 and the trailer 800.

As can be seen from FIG. 6, vehicle 700 is physically and electrically coupled together via connecting portions 750, 850. In various embodiments, connecting portions 750, 850 can represent an electronic connection between the vehicle and trailer by way of radio waves or other suitable means for "remote" transmission of data.

As discussed above, a controller in the vehicle 700 can be configured to perform any of the foregoing operations and functions for the trailer 800. Likewise, a controller 700 in the trailer 800 can be configured to perform any of the foregoing operations and functions for the vehicle 700. Some or all of items 200 (systems or housings) provide for backup or redundant capabilities for other items in the vehicle, as well as items in the trailer. Thus, some or all of items 200 may be interchangeable with items in the vehicle 700 and/or the trailer

800. Moreover, items in the vehicle 700 may be cooperative with items in the trailer and vice versa.

While the present invention has been described in conjunction with a number of embodiments, the invention is not to be limited to the description of the embodiments contained herein, but rather is defined by the claims appended hereto and their equivalents. It is further evident that many alternatives, modifications, and variations would be or are apparent to those of ordinary skill in the applicable arts. Accordingly, all such alternatives, modifications, equivalents, and variations that are within the spirit and scope of this invention.

What is claimed is:

1. A modular power distribution backplane for a controller area network (CAN) of a vehicle having a J1939 bus, the modular power distribution backplane being configured to be housed in a housing with an access portion to physically access the modular power distribution backplane, and the modular power distribution backplane comprising:
    a base substrate having a first side and a second side opposite to the first side and being sized to fit entirely inside the housing;
    a plurality of receptacles coupled to the first side of the base substrate, each said receptacle being configured to receive a modular power component, at least one of said receptacles being configured to receive a modular power component in the form of a circuit board, and at least one of said receptacles being configured to receive a modular power component in the form of a power element;
    a controller coupled to the base substrate; and
    a plurality of dual-operation tags in one-to-one relationship with said receptacles, each said dual-operation tag being configured with a visual indicator and as a key for coupling modular power components to correct ones of said receptacles,
    wherein each said dual-operation tag is physically configured as the key for coupling modular components to the modular power distribution backplane,
    wherein each said dual-operation tag is physically configured as the visual indicator,
    wherein the visual indicators are visible via the access portion of the housing,
    wherein said controller is configured to generate information for the physical and electrical coupling of modular power components to receptacles of the modular power distribution backplane, to verify that the modular power components have been properly coupled, and to facilitate an indication of the verifying, and
    wherein said controller is configured to verify that the modular power components have been coupled based on the generated information for physical and electrical coupling, the generated information including instructions for placement of modular power components in the backplane.

2. The modular power distribution backplane of claim 1, wherein said controller is configured to determine whether a modular power component already coupled to the modular power distribution backplane requires replacing, to facilitate an indication of the already coupled modular power component to be replaced, to identify another modular power component to replace the indicated modular power component to be replaced, and to facilitate an indication of the another modular power component.

3. The modular power distribution backplane of claim 2, wherein the indication of the already coupled modular power component to be replaced includes one or more of a type of modular component, a name of modular power component, a configuration of modular power component, and a location of modular power component.

4. The modular power distribution backplane of claim 1, wherein each said receptacle has associated therewith a plurality of dual-operation tags.

5. The modular power distribution backplane of claim 1, wherein the visual indicator operation of the dual-operation tags includes one or more of a physical configuration, a location on the backplane, a location on an associated receptacle, an arrangement, a shape, a size, a color, a number of tags, and a label or indicia on the dual-operation tags.

6. The modular power distribution backplane of claim 1, wherein the key operation of the dual-operation tags is based on at least one of a physical characteristic of the dual-operation tag and a physical location of the dual-operation tag.

7. The modular power distribution backplane of claim 1, wherein each said dual-operation tag has a physical position and configuration to physically prevent an incorrect modular power component from being coupled to the associated receptacle.

8. A modular power distribution backplane, the modular power distribution backplane being configured to be housed in a housing with an access portion to physically access the modular power distribution backplane, and the modular power distribution backplane comprising:
    a base substrate having a first side and a second side opposite to the first side and being sized to fit entirely inside the housing;
    a plurality of receptacles coupled to the first side of the base substrate, each said receptacle being configured to receive a modular power component, at least one of said receptacles being configured to receive a modular power component in the form of a circuit board, and at least one of said receptacles being configured to receive a modular power component in the form of a power element;
    a controller coupled to the base substrate; and
    a plurality of dual-operation tags in one-to-one relationship with said receptacles, each said dual-operation tag being configured with a visual indicator and as a key for coupling modular power components to correct ones of said receptacles,
    wherein each said dual-operation tag is physically configured as the key for coupling modular components to the modular power distribution backplane,
    wherein each said dual-operation tag is physically configured as the visual indicator,
    wherein the visual indicators are visible via the access portion of the housing,
    wherein said controller is configured to generate information for the physical and electrical coupling of modular power components to receptacles of the modular power distribution backplane, to verify that the modular power components have been properly coupled, and to facilitate an indication of the verifying, and
    wherein said controller is configured to verify that the modular power components have been coupled based on the generated information for physical and electrical coupling, the generated information including instructions for placement of modular power components in the backplane.

9. The modular power distribution backplane of claim 8, wherein said controller is configured to determine whether a modular power component already coupled to the modular power distribution backplane requires replacing, to facilitate an indication of the already coupled modular power component to be replaced, to identify another modular power component to replace the indicated modular power component to be replaced, and to facilitate an indication of the another modular power component.

10. The modular power distribution backplane of claim 9, wherein the indication of the already coupled modular power component to be replaced includes one or more of a type of modular component, a name of modular power component, a configuration of modular power component, and a location of modular power component.

11. The modular power distribution backplane of claim 8, wherein each said receptacle has associated therewith a plurality of dual-operation tags.

12. The modular power distribution backplane of claim 8, wherein the visual indicator operation of the dual-operation tags includes one or more of a physical configuration, a location on the backplane, a location on an associated receptacle, an arrangement, a shape, a size, a color, a number of tags, and a label or indicia on the dual-operation tags.

13. The modular power distribution backplane of claim 8, wherein the key operation of the dual-operation tags is based on at least one of a physical characteristic of the dual-operation tag and a physical location of the dual-operation tag.

14. The modular power distribution backplane of claim 8, wherein each said dual-operation tag has a physical position and configuration to physically prevent an incorrect modular power component from being coupled to the associated receptacle.

* * * * *